United States Patent
Jang et al.

[11] Patent Number: 5,956,596
[45] Date of Patent: Sep. 21, 1999

[54] METHOD OF FORMING AND CLEANING A LASER MARKING REGION AT A ROUND ZONE OF A SEMICONDUCTOR WAFER

[75] Inventors: Se-Yeon Jang, Paldal-gu; Young-Jin Cho, Suwon; Dong-Heui Jang, Suwon; Jeong-Yeal Kim, Suwon, all of Rep. of Korea

[73] Assignee: Samsung Electronics Co., Ltd., Suwon, Rep. of Korea

[21] Appl. No.: 08/980,912

[22] Filed: Dec. 1, 1997

Related U.S. Application Data

[63] Continuation-in-part of application No. 08/743,882, Nov. 6, 1996, abandoned.

[30] Foreign Application Priority Data

Nov. 6, 1995 [KR] Rep. of Korea ....................... 95-39889

[51] Int. Cl.⁶ ................................................. H01L 21/76
[52] U.S. Cl. ................................................. 438/401
[58] Field of Search ............................................. 438/401

[56] References Cited

U.S. PATENT DOCUMENTS

| | | | |
|---|---|---|---|
| 4,794,238 | 12/1988 | Hampton | 235/462 |
| 4,825,093 | 4/1989 | Kiriseko et al. | 250/566 |
| 4,896,034 | 1/1990 | Kiriseko | 250/271 |
| 5,051,807 | 9/1991 | Morozumi | 357/40 |
| 5,552,591 | 9/1996 | Bossen et al. | 235/462 |
| 5,653,045 | 8/1997 | Ferrell | 34/341 |

FOREIGN PATENT DOCUMENTS

| | | | |
|---|---|---|---|
| 0 488 053 A1 | 3/1992 | European Pat. Off. | 257/620 |
| 4-106960 | 4/1992 | Japan | 257/797 |

OTHER PUBLICATIONS

Advertisement Sheet, "Hine Design: The best kept secret in Robotics and Automation", Semicon Daily News, Jul. 14, 1997.

*Primary Examiner*—Brian Dutton
*Attorney, Agent, or Firm*—Jones Volentine, LLP

[57] ABSTRACT

The invention relates to a wafer for use as a substrate for a semiconductor device, the wafer comprising a round zone formed along a circumference thereof; a flat zone wherein the circumference thereof is partially cut in a straight line; and a laser marking region functioning as a wafer bar-code which is formed in an upper portion of the round zone opposite to and apart from the flat zone. The wafer bar-code has holes having about 2 μm depth and is formed by a soft marking process. A good fine pattern can be formed on the wafer with a follow-on patterning process by substantially cleaning photoresist materials remaining in holes of the laser marking region. Further, the occurrence of G-defects can be reduced, such defects being caused by photoresist particles remaining on the surface of the wafer.

6 Claims, 5 Drawing Sheets

METHOD OF FORMING AND CLEANING A LASER MARKING REGION AT A ROUND ZONE OF A SEMICONDUCTOR WAFER

This application is a continuation-in-part of U.S. application Ser. No. 08/743,882, filed Nov. 6, 1996, now abandoned.

BACKGROUND OF THE INVENTION

1. Field of the Invention

The present invention relates to a semiconductor device, and more particularly to a method of cleaning a semiconductor wafer which has a laser marking region formed at a round zone thereof.

2. Description of the Prior Art

As shown in FIG. 1A, a prior art semiconductor wafer 10 has a round zone 14a and a straight flat zone 14b. In such a wafer 10, a laser marking region 12 is provided to serve as a bar-code 12a of the wafer which has a plurality of holes or etched cavities 12b for identification. The laser marking region 12 is formed on a main surface of the wafer and in the vicinity of the flat zone 14b by a hard-marking process which uses a laser beam.

Processing high quality integrated circuits with desired yield rates from a wafer requires, inter alia, a clean wafer surface and full utilization of the wafer surface area. One of the processing problems that causes reduced yields is photoresist fragments remaining on the wafer surface after a photolithography process has been performed. Such photoresist fragments contaminate the wafer surface and cause defective integrated circuits.

As shown in FIG. 1A, a conventional photoresist 16 is applied to the center of the wafer 10 in liquid form. The wafer 10, which is vacuum mounted on a spin chuck 52, is rotated by a motor 54 to spread the photoresist material across the entire surface of the wafer 10 to form a photoresist layer 16a. See FIG. 1B. However, due to the centrifugal force created by the spinning motion, the photoresist layer 16a tends to thicken at the edges of the wafer and wrap around the edges of the wafer as shown in FIG. 1B, thereby creating an non-uniform photoresist region 16b that is inappropriate for integrated circuit patterning, which in turn, reduces the effective wafer surface utilization area.

In addition, this non-uniform photoresist region 16b tends to break-up or fragment during subsequent chemical etching processes. The photoresist fragments can contaminate the etching solution used in solution etching processes, which then contaminate the surface of a patterned wafer.

The photoresist 16 may also become lodged in the identification holes or cavities 12b of the bar code 12a of the laser marking region 12 as shown in FIG. 1C. The depth $M_{depth}$ of the holes or cavities may be on the order of 40 $\mu$m.

Referring to FIG. 1B and FIG. 1D, there is shown a side rinse method for removing the non-uniform photoresist region 16b, and a plan view of the wafer 10 resulting therefrom, respectively. In FIG. 1B, a nozzle 30 is fixed above the wafer 10 and positioned to deliver a chemical etchant 32, such as a thinner, to the edge of the wafer 10 disposed on the spin chuck 52 while the wafer 10 is rotated by the motor 54. The etchant 32, therefore, traces a substantially uniform path 14c (dashed line) of a certain width 'x' around the periphery of the wafer 10 where most of the photoresist 16b is removed.

However, in the plan view of the wafer in FIG. 1D, it is shown that a substantial portion of the laser marking region 12 is not covered by the circular cleaning path 14c due to the positioning of the laser marking region 12 in the flat zone area 14b of the wafer 10. FIG. 1E is a magnified plan view of the portion of the laser marking region 12 in the vicinity of the flat zone 14b. The chemical etchant 32 delivered during the side rinse process has failed to contact the inner portion 122 of the laser marking region 12 such that the photoresist 16 remains in the identification holes or cavities 12b in the inner portion 122. Moreover, due to the combination of the depth of the identification holes or cavities 12b and the thickness of the photoresist 16b at the edge portion of the wafer 10, some photoresist fragments 124 still remain in the outer portion 125 of the laser marking region 12 that was exposed to the chemical etchant 32.

During a subsequent etching and wet cleaning process, the photoresist material 16 lodged in the bar-code 12a of the laser marking region 12 is separated from the laser marking region 12 by contact with a solution bath thereby inducing a bubble whirl phenomenon. Bubble whirl phenomenon refers to a situation where the cleaning solution penetrates evenly through the whole surface of the silicon wafer that is dipped in a solution bath because of the presence of bubbles, which are generated from the bottom of the solution bath during the wet cleaning process and flow upwards. Unfortunately, as described above, the photoresist fragments that are separated by the solution bath become contaminating particles that are deposited on the wafer.

This contamination is illustrated in FIG. 2. While cleaning a semiconductor wafer with a wet cleaning system, particles remaining in the semiconductor wafer move from the laser marking region 12 of the wafer to the center thereof (shown as lines 13 in FIG. 2) by the bubble whirl phenomenon in the solution bath 20 of the cleaning system. More specifically, when the wafer is put in the solution bath 20 of a wafer cleaning system or a wafer stripe system in order to remove a photoresist material formed thereon, the flat zone 14b of the wafer 10 is closest to the bottom of the solution bath 20. During the cleaning process, the particles 16 separated from the holes of the laser marking region 12 move from the laser marking region to the center of the wafer 10 by the bubble whirl phenomenon.

It is known in the art that particles of photoresist fragments are a factor causing G-defects in a semiconductor wafer. G-defects mean defects occurring when particles of a photoresist material are gelatinated on the wafer surface.

During the fabrication of a semiconductor device using the above wafer 10, particularly an etching process, an EEW (edge expose wafer) system is used to prevent the clamp of the etching instrument from staining due to photoresist particles. However the particles remain lodged in the laser marking region 12, even though the particles in the flat zone 14b of the wafer 10 are sufficiently removed by using such an EEW system. This is because the clamp of the etching instrument always occupies a portion of the laser marking region 12 in the vicinity of the flat zone 14b. As a result, the remaining photoresist 16 in the holes of the laser marking region 12 serve as contaminating particles during the process that follows.

It is well known in the art that such photoresist particles are detrimental to the formation of a fine pattern, and often result in the formation of a poor pattern. Another disadvantage of locating the laser marking region 12 in the flat zone 14b of the wafer 10 is that is reduces the surface area usable for providing dies, that is, it reduces the net die area of the wafer 10.

It is desired, therefore, that the non-uniform photoresist portion be completely removed, especially in the laser marking region, prior to patterning to thereby prevent wafer defects. It is also desired to position the laser marking region on the wafer surface so as to increase the net die area.

SUMMARY OF THE INVENTION

Accordingly, it is an object of the present invention to provide a semiconductor wafer structure in which photoresist material formed in holes of a laser marking region may be completely cleaned, in order that a good fine pattern may be formed on the wafer.

It is another object of the invention to provide a semiconductor wafer which can prevent G-defects from occurring due to the presence of photoresist particles.

Another object of the invention is to position the laser marking region on the wafer surface so as to increase the net die area.

According to one aspect of the present invention, the wafer that is used as a semiconductor substrate comprises a round zone formed along a circumference thereof; a flat zone formed by partially cutting the circumference in a straight line; and a laser marking region which functions as a bar-code for wafer identification and is formed in an upper portion of the round zone opposite to and apart from the flat zone.

In the wafer, the bar-code for wafer identification has a plurality of holes having about a 2 μm depth. Also, the marking region is formed by a soft marking. Soft marking means creating slight grooves in the wafer marking region, having a depth of about 2 μm, to mark the wafer.

In another aspect, the present invention provides a method of cleaning an identification mark formed on an active surface of a wafer having a round edge zone region and a flat edge zone region. The method includes steps of forming the identification mark substantially near a periphery of the wafer in the round edge zone region. The identification mark has a cavity pattern formed therein. In the next step, a photoresist material is deposited on a center area of the active surface of the wafer, after which the wafer is rotated to distribute the photoresist material entirely along the active surface of the wafer including the cavity pattern of the identification mark. A rinse is then applied to the periphery of the wafer to substantially remove the photoresist material from the round edge zone region and an entirety of the cavity pattern of the identification mark. Finally, the wafer is submerged in a solution bath to remove any remaining photoresist material from the active surface of the wafer and the cavity pattern of the identification mark.

The entirety of the cavity pattern of the identification mark is thus formed completely within the spray width of the chemical rinse applied to the wafer during the rinse step. Moreover, the cavity pattern is formed in the round edge zone region between the periphery of the wafer and a die area defined by a plurality of die on the active surface.

BRIEF DESCRIPTION OF THE ATTACHED DRAWINGS

DETAILED DESCRIPTION OF PREFERRED EMBODIMENTS

This invention may be better understood and its object will become apparent to those skilled in the art by the description below of preferred embodiments and by reference to the accompanying drawings.

Figure 3:
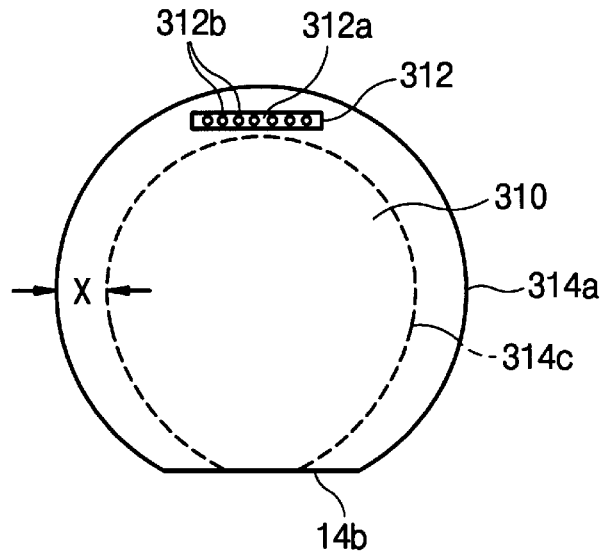
FIG. 3 is a plan view showing a semiconductor wafer according to the embodiment of the present invention.

Referring to FIG. 3, a novel semiconductor wafer 310 in accordance with the present invention has a laser marking region 312 which is formed in the vicinity of a round zone 314a opposite to a flat zone 314b.

The laser marking region 312 has a wafer bar-code 312a which comprises a plurality of identification holes or cavities 312b. The alignment of the laser marking region 312 in the round zone region 314a opposite the flat zone region 314b provides significant benefits, which are described below in the method and apparatus of the present invention.

As shown in FIG. 3, the dimensions of which have been exaggerated for clarity, the laser marking region 312 is formed substantially near the round edge 314a of the wafer, opposite to the flat zone 314b. This may be accomplished, for example, by using a laser to scribe or engrave identification marks on the wafer surface. Other known methods of providing scribed or engraved identification marks in the wafer surface are contemplated within the scope of the present invention.

Figure 1A:
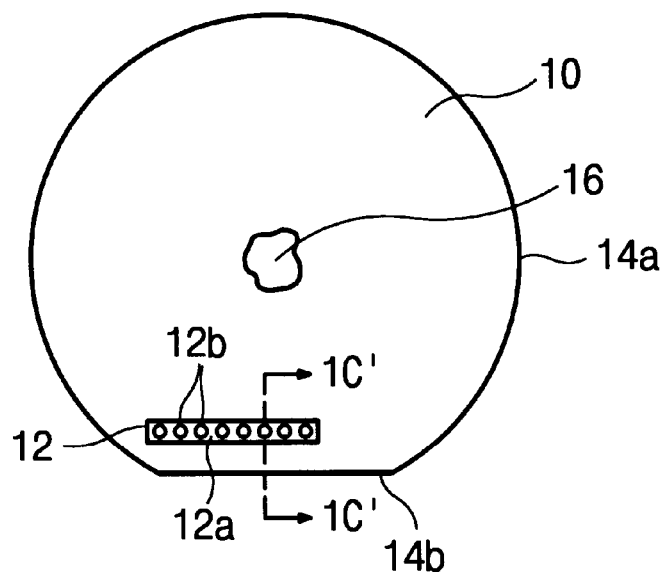
FIG. 1A is a plan view showing a prior art semiconductor wafer in which a wafer bar-code is arranged in the vicinity of a flat zone.
Figure 1B:
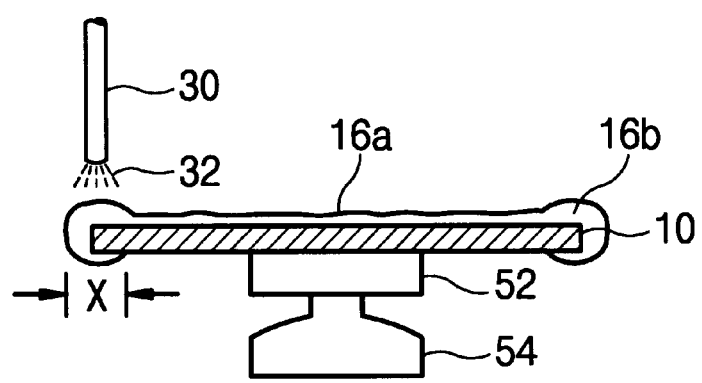
FIG. 1B is a side view of a wafer placed on a spin chuck and having a photoresist layer coated thereon.

After a photoresist material 16 is deposited on the entire surface of the wafer, including the marking region 312, the wafer is subjected to a side rinse treatment to remove the non-uniform photoresist portion 16b (see FIG. 1B). In contrast to the side rinse treatment generally described with reference to FIG. 1B, the side rinse treatment completely covers the marking region 312 in the present invention. This is accomplished by positioning the marking region 312 entirely within the distance 'x' defining the width of the path 314c (dashed line) traced around the periphery of the wafer by the chemical etchant 32 sprayed through the nozzle 30. As before, the nozzle 30 is positioned to deliver the chemical etchant 32, such as a thinner, to the edge of the wafer disposed on the spin chuck 52 while the wafer is rotated by the motor 54.

Accordingly, the marking region 312 is completely covered by the circular cleaning path 314c, which removes a substantial amount of the photoresist 16 material lodged in the identification holes or cavities 312b.

Figure 5:
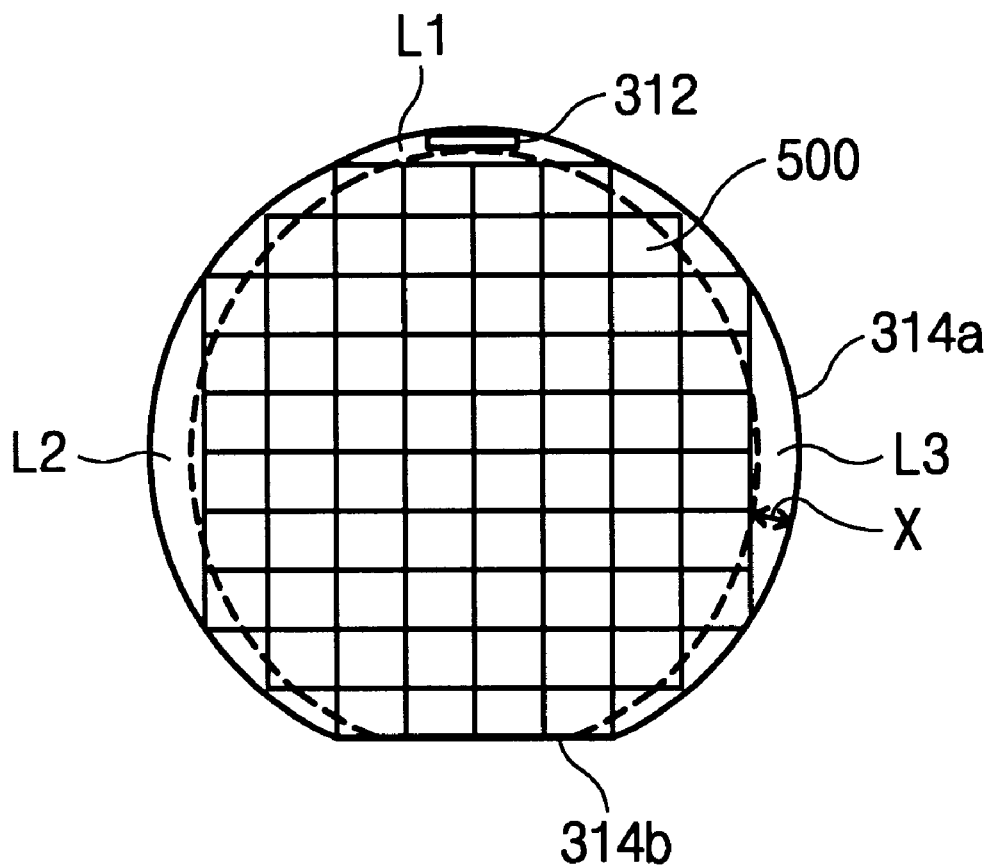
FIG. 5 is a plan view of an optimized die area of an active surface of the wafer with the laser marking region positioned in the round zone opposite to the flat zone of the wafer in accordance with the present invention.

FIG. 5 illustrates a plan view of an optimized die area, having a plurality of die 500 formed on an active surface of the wafer, with the laser marking region 312 positioned in the round zone 314a opposite to the flat zone 314b of the wafer in accordance with the present invention. The criteria for positioning the marking region 312 is thus two-fold. First, the marking region 312 must be positioned within a distance 'x' from the periphery of the wafer so as to be covered by a side rinse system that has a corresponding spray width 'x'. Second, the marking region 312 must be located outwardly of the net area defined by the plurality of dies 500. In other words, with the die arrangement shown in FIG. 5 and a side rinse system having a spray width 'x', the marking region may be positioned, for example, at location L1, directly opposite the flat zone 314b, or L2 or L3, rotated 90 degrees in either direction along the circumference of the wafer 310 from the flat zone 314b. Of course, any region meeting the above two criteria may be utilized for the marking region location.

Figure 4:
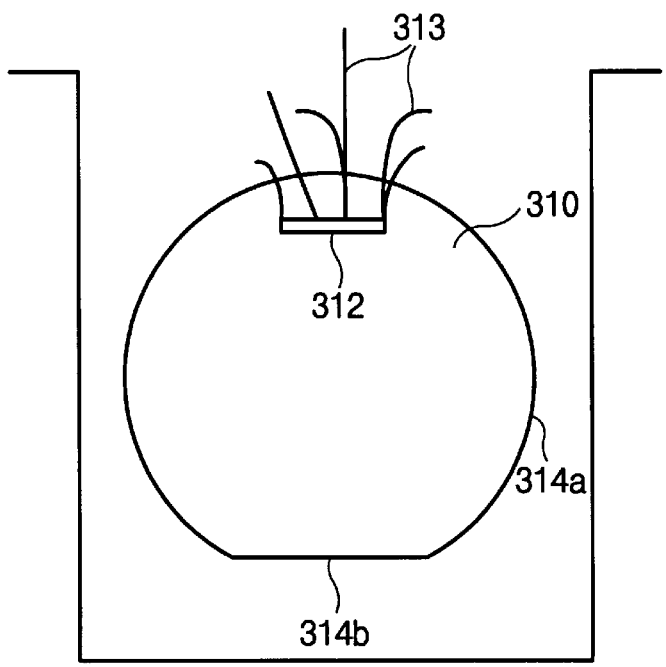
FIG. 4 is a schematic view illustrating that photoresist particles remaining on the wafer of FIG. 3 move from the laser marking region to the outside of the wafer by a bubble whirl phenomenon in a solution bath of a wet cleaning system.

Because laser marking region 312 is located in the round zone 314a of the wafer 310, when a photoresist material deposited on the wafer is selectively removed in a solution bath after performing a photoresist process to form a fine circuit pattern on the wafer 310 (shown in FIG. 4), photoresist particles remaining in the holes 312b of the bar-code 312a of the laser marking region 312 move from the laser marking region 312 to the upper outside of the wafer by a bubble whirl phenomenon, shown as lines 313 in FIG. 4.

More specifically, during a subsequent wet cleaning process, because the laser marking region 312 is not formed in the vicinity of the flat zone 314b but in the round zone 314a opposite to the flat zone, the photoresist particles remaining in the holes 312b move not to the center of the wafer 310 but to the outer periphery of the wafer 310 by the bubble whirl phenomenon that removes the photoresist material. As a result, none of particles of the photoresist material remain on the surface of the wafer 310.

Figure 1C:
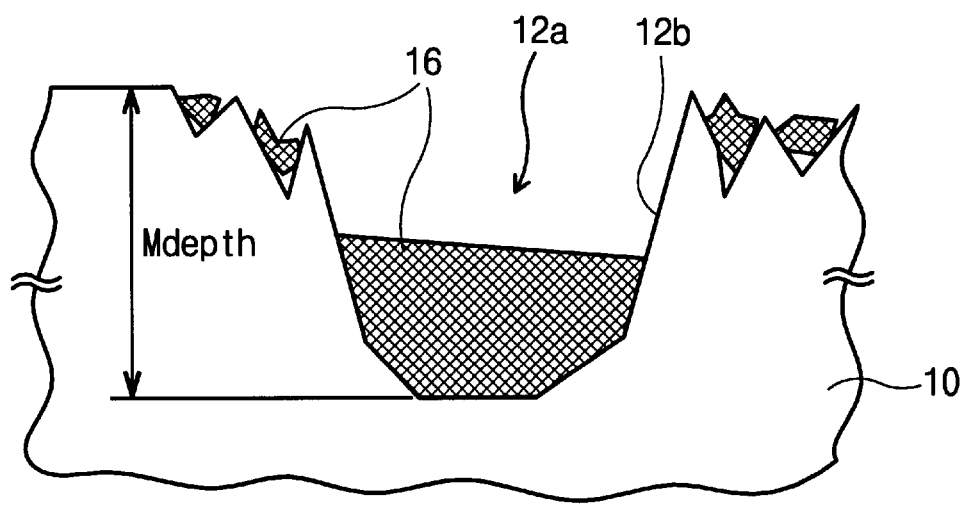
FIG. 1C is a cross sectional view taken along the line 1C'—1C' in FIG. 1A.
Figure 1D:
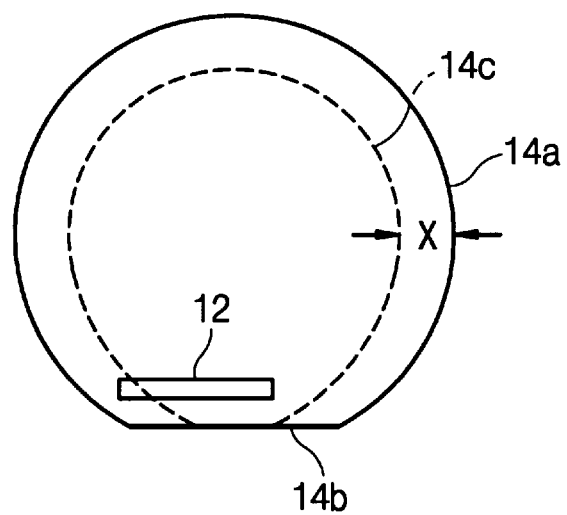
FIG. 1D is a plan view of the wafer of FIG. 1B after a side rinse treatment.
Figure 1E:
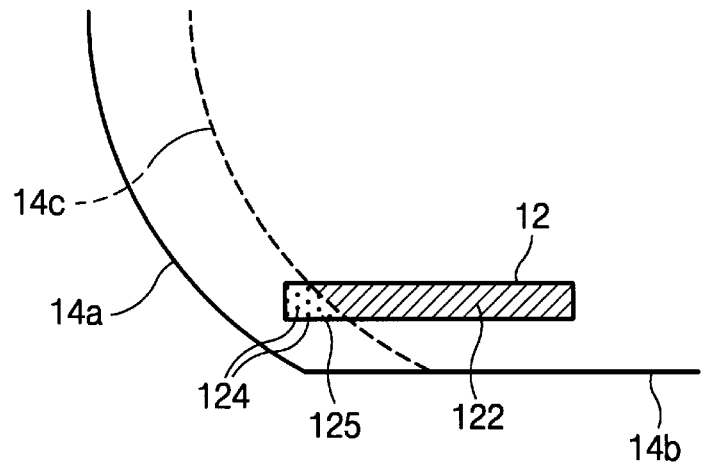
FIG. 1E is an enlarged view of a flat zone region of FIG. 1D.
Figure 2:
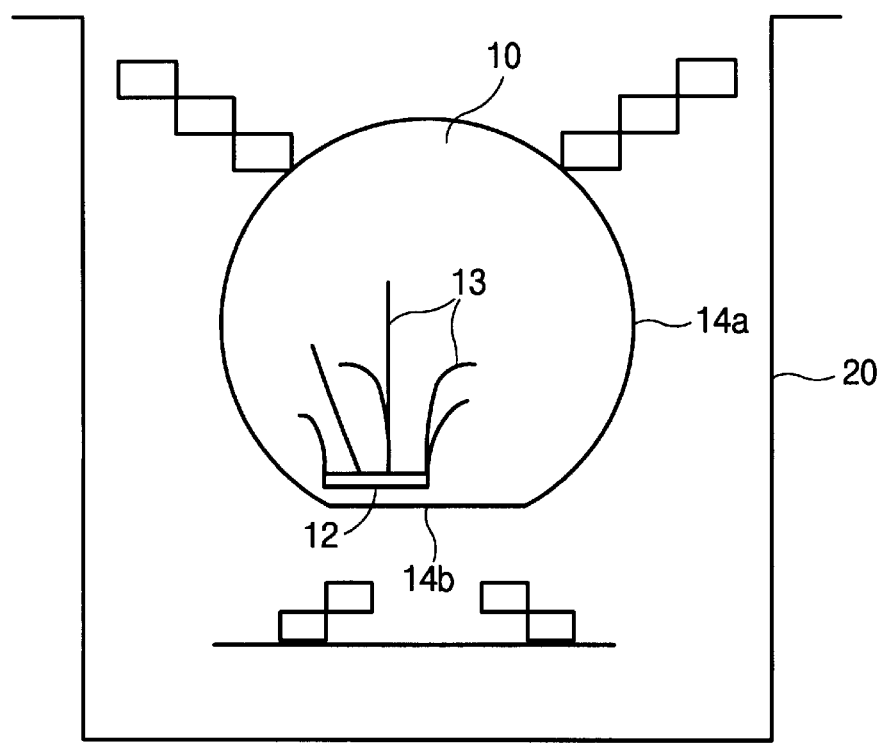
FIG. 2 is a schematic view illustrating that photoresist particles remaining on the wafer of FIG. 1A move from the laser marking region to the center of the wafer by a bubble whirl phenomenon in a solution bath of a wet cleaning system.

The holes 312b of the wafer bar-code 312a of the laser marking region 312 can be provided with about a 2 μm depth by using soft marking. Thus, the amount of photoresist particles remaining in the holes 312b can be remarkably reduced because each hole 312b in the laser marking region 312 is not as deep as that in FIG. 1C. The decrease in the amount of the photoresist material reduces the generation of photoresist particles that can contaminate the follow-on processes.

Also, the reduction of the photoresist particles reduces the formation of G-defects. Therefore, it is possible to make a good fine pattern on the wafer in subsequent processing steps.

In summary, by initially subjecting the entire marking region 312 to the side rinse treatment, a substantial amount, if not all of the photoresist material 16 may be rinsed from the identification marks or cavities 312b while removing the non-uniform photoresist portion 16b from the edges of the wafer 310.

Since the laser marking region 312 is formed in the round zone opposite to the flat zone, even if photoresist material remains in the holes 312b of the laser marking region, the photoresist material moves to the outer periphery of the wafer by the bubble whirl phenomenon occurring in the solution bath of the cleaning system during a cleaning process. As a result, there is no difficulty in making a good fine pattern.

Furthermore, while fabricating the semiconductor device using the wafer of the present invention, the clamp of the etching instrument always occupies the flat zone 314b of the wafer during the photoresist process. Because the laser marking region 312 is not in the flat zone 314b but in the round zone 314a, none of photoresist material remains in the occupied portion. Therefore, no substantial contaminating particles remain.

While this invention has been described with respect to that which is presently considered to be the most practical and preferred embodiments, it is to be understood that the invention is not limited to the disclosed embodiments. On the contrary, it is intended that the present invention cover various modifications and equivalent arrangements within the spirit and scope of the appended claims.

What is claimed is:

1. A method of cleaning an identification mark formed on an active surface of a wafer having a round edge zone region and a flat edge zone region, the method comprising steps of:

forming the identification mark substantially near a periphery of the wafer in the round edge zone region, the identification mark having a cavity pattern formed therein;

depositing a photoresist material on a center area of the active surface of the wafer;

rotating the wafer to distribute the photoresist material entirely along the active surface of the wafer including the cavity pattern of the identification mark;

applying a rinse to the periphery of the wafer to substantially remove the photoresist material from the round edge zone region and an entirety of the cavity pattern of the identification mark; and submerging the wafer in a solution bath to remove any remaining photoresist material from the active surface of the wafer and the cavity pattern of the identification mark.

2. The method of claim 1, wherein the rinse applying step is performed by spraying a chemical rinse through a nozzle positioned above the periphery of the active surface of the wafer, the chemical rinse having a spray width when applied to the active surface, wherein the entirety of the cavity pattern of the identification mark is formed completely within the spray width of the chemical rinse.

3. The method of claim 2, wherein chemical the rinse is a thinner applied to the periphery of the wafer.

4. The method of claim 2, wherein the forming step is carried out using a laser to scribe the cavity pattern.

5. The method of claim 4, wherein during the forming step, the cavity pattern is formed in the round edge zone region between the periphery of the wafer and a die area defined by a plurality of die on the active surface.

6. The method of claim 5, wherein the during the submerging step, the remaining photoresist material is removed from the active surface and the cavity pattern of the identification mark by a bubble whirl process.

* * * * *